United States Patent
Parkin et al.

(10) Patent No.: US 7,276,384 B2
(45) Date of Patent: Oct. 2, 2007

(54) MAGNETIC TUNNEL JUNCTIONS WITH IMPROVED TUNNELING MAGNETO-RESISTANCE

(75) Inventors: Stuart Stephen Papworth Parkin, San Jose, CA (US); Mahesh Govind Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/151,470

(22) Filed: Jun. 13, 2005

(65) Prior Publication Data

US 2005/0226043 A1    Oct. 13, 2005

Related U.S. Application Data

(62) Division of application No. 10/720,962, filed on Nov. 24, 2003.

(51) Int. Cl.
*H01L 21/00* (2006.01)
*H01L 29/76* (2006.01)

(52) U.S. Cl. .......................... 438/3; 438/257; 438/593; 257/295

(58) Field of Classification Search .................... 438/3, 438/257; 257/295; 360/324.2
See application file for complete search history.

(56) References Cited

U.S. PATENT DOCUMENTS

| | | | |
|---|---|---|---|
| 5,341,188 A | 8/1994 | Parkin et al. | |
| 5,465,185 A | 11/1995 | Heim et al. | |
| 5,640,343 A | 6/1997 | Gallagher et al. | |
| 5,801,984 A | 9/1998 | Parkin | |
| 5,841,692 A | 11/1998 | Gallagher et al. | |
| 5,898,548 A | 4/1999 | Dill et al. | |
| 6,028,786 A | 2/2000 | Nishimura | |
| 6,097,625 A | 8/2000 | Scheuerlein | |
| 6,166,948 A | 12/2000 | Parkin et al. | |
| 6,341,053 B1 | 1/2002 | Nakada et al. | |
| 6,359,289 B1 | 3/2002 | Parkin | |
| 6,436,526 B1 | 8/2002 | Odagawa et al. | |
| 6,445,024 B1 | 9/2002 | Kwon et al. | |
| 6,518,588 B1 | 2/2003 | Parkin et al. | |
| 6,519,124 B1 | 2/2003 | Redon et al. | |
| 6,522,573 B2 | 2/2003 | Saito et al. | |
| 6,538,861 B1 | 3/2003 | Hayashi et al. | |
| 6,538,919 B1 | 3/2003 | Abraham et al. | |
| 6,556,473 B2 | 4/2003 | Saito et al. | |

(Continued)

OTHER PUBLICATIONS

S. Colis et al., "CoFe/Ir/CoFe Artificial Antiferromagnetic Sandwich as a Hard Magnetic Layer in Hard-Soft GMR Sensors," IEEE Transactions on Magnetics, vol. 37, No. 4, pp. 1736-1738, Jul. 2001.

(Continued)

*Primary Examiner*—Dung A. Le
(74) *Attorney, Agent, or Firm*—Joseph P. Curtin, L.L.C.

(57) ABSTRACT

A magnetic tunnel element that can be used, for example, as part of a read head or a magnetic memory cell, includes a first layer formed from an amorphous material, an amorphous tunnel barrier layer, and an interface layer between the first layer and the tunnel barrier layer. The interface layer is formed from a material that is crystalline when the material is in isolation from both the first layer and the tunnel barrier layer. Alternatively, the thickness of the interface layer is selected so that the interface layer is not crystalline. The first layer is formed from at least one material selected from the group consisting of amorphous ferromagnetic material, amorphous ferromagnetic materials, and amorphous non-magnetic materials. The interface layer is formed from a material selected from the group consisting of a ferromagnetic material and a ferrimagnetic material.

13 Claims, 10 Drawing Sheets

U.S. PATENT DOCUMENTS

| | | | |
|---|---|---|---|
| 6,819,532 B2 * | 11/2004 | Kamijo | 360/324.11 |
| 2001/0005011 A1 | 6/2001 | Minakata et al. | |
| 2001/0026471 A1 | 10/2001 | Michijima et al. | |
| 2002/0054462 A1 | 5/2002 | Sun et al. | |
| 2002/0097534 A1 | 7/2002 | Sun et al. | |
| 2002/0154456 A1 | 10/2002 | Carey et al. | |
| 2002/0159203 A1 | 10/2002 | Saito et al. | |
| 2003/0035249 A1 | 2/2003 | Ho et al. | |
| 2003/0072109 A1 | 4/2003 | Sharma et al. | |

OTHER PUBLICATIONS

M. Julliere, "Tunneling Between Ferromagnetic Films," Physics Letters, vol. 54A, No. 3, pp. 225-226, Sep. 8, 1975.

U.K. Klostermann et al., "Influence of a magnetic seed line on the switching behavour of submicrometre sized magnetic tunnel junctions," J. of Phys. D: Applied Phys. 34 (2001) 2117-2122.

R. Meservey et al., "Spin-polarized electron tunneling," Physics Reports (Review Section of Physics Letters) 238, No. 4 (1994), pp. 173-243.

H.A.M. van den Berg et al., "Magnetic Tunnel Sensors with Co-Cu Artificial Antiferromagnetic (AAF) Hard Subsystem," IEEE Transactions on Magnetics, vol. 35, No. 5, pp. 2892-2894, Sep. 1999.

C.-Y. You et al., "Enhancement of switching stability of tunneling magnetoresistance systems with artificial ferrimagnets," Journal of Applied Physics, vol. 92, No. 7, pp. 3886-3889, Oct. 1, 2002.

S. Yuasa et al., "Spin-Polarized Resonant Tunneling In Magnetic Tunnel Junctions," Science, vol. 297, pp. 234-237, Jul. 12, 2002.

* cited by examiner

MAGNETIC TUNNEL JUNCTIONS WITH IMPROVED TUNNELING MAGNETO-RESISTANCE

CROSS-REFERENCE TO RELATED APPLICATION

The present patent application is a divisional non-provisional patent application of non-provisional patent application Ser. No. 10/720,962, invented by Stuart Steven Papworth Parkin et al., filed Nov. 24, 2003, and which is incorporated by reference herein.

BACKGROUND OF THE INVENTION

1. Field of the Invention

The present invention relates to Magnetic Tunnel Junction (MTJ) Magnetoresistive (TMR) devices for use as magnetic field sensors, such as read heads for reading magnetically recorded data, as memory cells in nonvolatile magnetic random access memory (MRAM) cells, and for magnetic logic and spintronic applications. More particularly, the present invention relates to magnetic tunneling elements and MTJ devices having significantly improved magnetoresistance.

2. Description of the Related Art

Magnetic Tunnel Junctions (MTJ) are promising candidates for memory storage cells by enabling a nonvolatile, high performance Magnetic Random Access Memory (MRAM). An MTJ-based MRAM has the potential to rival conventional Dynamic Random Access Memory (DRAM) in density and cost, and conventional Static Random Access Memory (SRAM) in speed. In addition, MRAM is truly nonvolatile, that is, the state of the memory is maintained even after the power has been removed from the memory. Furthermore, each MTJ bit can be read non-destructively without changing its magnetic state. For MTJ-MRAM to directly replace conventional semiconductor memory technologies, however, it is preferred that the materials making up an MTJ memory are built on complementary metal oxide semiconductor (CMOS) circuits that are necessary to read and write the state of the MTJ cells. For example, MTJ-MRAM arrays having a cross-point architecture are described in U.S. Pat. No. 6,097,625 to Scheuerlein and U.S. Pat. No. 5,640,343 to Gallagher et al.

An MTJ includes two ferromagnetic layers separated by a thin insulating layer, wherein the resistance (or conductance) through the layers depends on the relative orientation of the magnetic moments of the ferromagnetic layers. The change in resistance as the orientation of the moments is changed from parallel to anti-parallel divided by the resistance for the parallel state is the tunneling magnetoresistance (TMR). The most useful MTJ for memory cells has the magnetic moment of one of the ferromagnetic (FM) layers (termed a storage layer) free to rotate and the magnetic moment of the other ferromagnetic layer fixed or pinned (termed a reference layer) by being exchange-biased with a thin antiferromagnetic (AF) layer.

In a cross-point MRAM, the MTJ devices are switched by the application of two magnetic fields that are applied along two orthogonal directions, the "easy" and "hard" axes of the MTJ device. Typically, the magnetic easy and hard anisotropy axes are defined by the shape of the MTJ element through the self demagnetizing fields. The MRAM array contains a series of MTJ elements arranged along a series of word and bit lines, typically arranged orthogonal to one another. For example, FIG. 1 depicts an exemplary cross-point array 100 of an MTJ-MRAM. Cross-point array 100 includes a plurality of MTJ memory cells 101, a plurality of row lines 102 (also referred to as word lines), and a plurality of column lines 103 (also referred to as bit lines). An MTJ memory cell 101 is located at an intersection of a row line 102 and a column line 103. The magnetic switching fields are realized by passing currents along the word and bit lines. All of the cells along a particular word or bit line are subjected to the same word or bit line field. Thus, the width of the distribution of switching fields for the selected MTJs (those subject to the vector sum of the bit and word line fields) must be sufficiently narrow that it does not overlap the distribution of switching fields for the half-selected devices. The magnetic moment within the MTJ devices lies along a particular direction, which is referred to as the "easy" axis. The orthogonal direction is the magnetic "hard" axis.

One of the most challenging problems for the successful development of MTJ memory storage cells is to obtain sufficiently uniform switching fields for a large array of MTJ cells. This uniformity can be characterized in various ways. One method is to use a parameter termed the "array quality factor" (AQF). The AQF represents the mean switching field at zero hard-axis field divided by the standard deviation of the same distribution for an array of MTJ devices. The AQF parameter is useful when the observed distribution of switching fields follows a Gaussian distribution. In some cases, though, the observed distribution of switching fields may not follow a simple Gaussian form, for example, when the magnetic elements may have two different ground states having similar energies.

Based on a statistical model that takes into account the MTJ memory cell size, shape, and pitch along the word and bit lines together with the pattern of written states of the MTJ elements for an 1 Mbit array, it is estimated that an AQF above ~10 to 20 is needed for reliable write operation (write yield close to 100%) of such a MRAM chip having elliptical cells formed at 0.18 micron ground rules. The AQF required is sensitive to details of the writing procedure. The observed AQF is influenced by various factors including the lithographic patterning of the individual MTJ storage elements, as well as details of the process integration, especially through the dielectric material surrounding the patterned edges of the MTJ elements, and by the MTJ materials and structure itself. One clear limitation on the AQF is the polycrystalline nature of the MTJ materials, which becomes especially important for high density MRAM in which the size of the MTJ element is so small that the MJT element contains only a small number of crystalline grains. It has been hypothesized that for very small MTJ cells, the relatively small number of crystalline grains having random anisotropy axes can lead to significant variations in magnetic switching field from device to device. Improved AQFs may be obtained by either reducing the crystalline grain size or by using amorphous ferromagnetic (a-FM) materials having no macroscopic granular structure.

MTJs with a-FM storage layers, in addition to having a narrower distribution of magnetic switching fields, are also expected to have other improved magnetic properties, such as lower values of the coercive fields $H_c$. The latter property is advantageous as this allows for reduced write currents. Typically, an amorphous FM will have a lower magnetic moment than its crystalline counterpart because the alloy is made amorphous by the addition of non-magnetic elements, thereby diluting the magnetization. This aspect can be advantageous for MRAM applications because the self-demagnetization fields, which are directly proportional to the magnetization of the ferromagnet for otherwise identical structures, would thereby be reduced. The Curie temperature ($T_c$) of amorphous alloys can be varied by varying the alloy composition, but can be sufficiently high for MRAM and other applications. For example, this may be useful for thermally-assisted writing techniques. See, for example, U.S. Pat. No. 6,538,919 to Abraham et al. Similarly, other magnetic properties, for example, the magnetostriction of the amorphous alloy can often be tuned to the required value by choice of the alloy composition. In this regard, it is useful to be able to add a considerable number of different constituents to the amorphous alloy to be able to engineer the magnetic properties of the alloy as is desired.

Amorphous FM films are also expected to have improved elastic properties because such films will resist plastic deformation. The lack of an ordered atomic lattice implies the absence of dislocations. More importantly, a-FM layers should exhibit improved corrosion resistance due to the absence of grain boundaries along which contaminants can diffuse. Similarly, the thermal stability of MTJs having a-FM layers will be more thermally stable because diffusion of material is enhanced along grain boundaries in thin film materials.

Previous studies have disclosed that magnetic storage layers consisting of CoFeB or CoFeNbB, or CoNbB a-FM alloys yield MTJs or giant magnetoresistive (GMR) devices having softer magnetic characteristics (i.e., lower coercivity) than equivalent MTJs or GMR devices having crystalline magnetic layers. See, for example, U.S. Pat. No. 6,436,526 to Odagawa et al. Also, see U.S. Pat. No. 6,028,786 to Nishimura, which describes the use of CoFeB alloys in an MTJ stack.

What is needed is an MTJ element having a high TMR and a thermal stability that can withstand typical MRAM processing thermal budgets.

BRIEF SUMMARY OF THE INVENTION

The present invention provides a magnetic tunneling element which provides a source of highly spin polarized electrons for a variety of applications. In particular, the magnetic tunneling element can be incorporated as part of a magnetic tunneling junction (MTJ) device, which thereby has higher TMR than prior art devices, while at the same time having high thermal stability that can withstand a typical MRAM processing thermal budget. The MTJ device with improved TMR can be used, for example, as a storage element in an MRAM, or as a sensing element, such as in a magnetic recording disk drive read head.

The advantages of the present invention are provided by a magnetic tunnel element having a first layer formed from an amorphous material, an amorphous tunnel barrier layer, such as $Al_2O_3$, and an interface layer between the first layer and the tunnel barrier layer. According to the present invention, the interface layer is formed from a material that is typically crystalline and typically not amorphous when the material is in isolation from both the first layer and the tunnel barrier layer. For a limited range of thickness of the interface layer, the magneto-tunneling characteristics of the magnetic tunneling element are improved. For example, the thickness of the interface layer is preferably less than ~25 Å when comprised of an alloy of Co and Fe. Alternatively, the thickness of the interface layer is selected so that the interface layer is not crystalline. The first layer is preferably formed from at least one material selected from the group consisting of an amorphous ferromagnetic material and an amorphous ferrimagnetic material. For example, the first layer can be a CoFeB alloy of the form $(Co_{70}Fe_{30})_{100-x}B_x$ in which x is between about 15 and 20. Alternatively, the first layer is an alloy of the form CoFeX or CoFeXY, in which X and Y are chosen from the group consisting of B, Hf, Zr, C, Be, Si, Ge, P and Al, so that at least one of X and Y of the alloy causes the alloy to be amorphous. The interface layer is advantageously formed from at least one material selected from the group consisting of ferromagnetic materials and ferrimagnetic materials. For example, the interface layer can be an Fe-containing alloy, such as CoFe containing between about 10 atomic percent and 60 atomic percent Fe. As another alternative, the Fe-containing alloy is NiFe. Or as another alternative, the Fe-containing alloy can be formed from a CoNiFe alloy.

The magnetic tunnel element can further include a second layer that is in contact with the tunnel barrier layer and formed from at least one material selected from the group consisting of ferromagnetic materials and ferrimagnetic materials. The first layer, the interface layer, the tunnel barrier layer and the second layer form a magnetic tunnel junction that has an improved tunneling magnetoresistance that is preferably greater than 50%.

Alternatively, the magnetic tunnel element can include a second interface layer that is formed from a material selected from the group consisting of ferromagnetic materials and ferrimagnetic materials and that is in contact with the tunnel barrier, as well as a second layer that is formed from at least one material selected from the group consisting of amorphous ferromagnetic materials and amorphous ferrimagnetic materials. The first layer, the interface layer, the tunnel barrier layer, the second interface layer, and the second layer form a magnetic tunnel junction that has an improved tunneling magnetoresistance that is preferably greater than 50%.

Alternatively, the magnetic tunnel element can further include a metal-containing layer that is in contact with the tunnel barrier layer and a semiconductor layer that is in contact with the first layer. The metal-containing layer includes a metallic layer that is formed from at least one of a non-ferromagnetic material and a non-ferrimagnetic material. The metal-containing layer, the tunnel barrier, the interface layer, the first layer and the semiconductor layer together form a magnetic tunneling transistor.

As yet another alternative, the magnetic tunnel element can further include a semiconductor material layer that is in contact with the tunnel barrier layer. The semiconductor layer, tunnel barrier layer, the interface layer and the first layer together form a spin-injector device. Additionally, there may be a metal containing layer between the tunnel barrier and the semiconductor.

The present invention also provides a method for forming a magnetic tunnel element in which an amorphous tunnel barrier layer is formed and an interface layer is formed on the tunnel barrier layer. According to the invention, the interface layer is formed from a material that is typically crystalline when the material is in isolation from the tunnel barrier layer. Alternatively, the thickness of the interface layer is selected so that the interface layer is not crystalline. The interface layer is formed from a material selected from the group consisting of ferromagnetic materials and ferrimagnetic materials. One technique that can be used so that the interface layer is not crystalline includes rapidly quenching the interface layer. Another technique that can be used so that the interface layer is not crystalline includes depositing the interface layer on the tunnel barrier layer at a cryogenic temperature when the interface layer is formed from one at least one of a ferromagnetic film and a ferrimagnetic film.

Still another technique that can be used so that the interface layer is not crystalline includes bombarding the interface layer with energetic ions after the interface layer has been formed on the tunnel barrier layer when the interface layer is formed from at least one of a ferromagnetic film and a ferrimagnetic film.

A first layer can be formed on the interface layer, such that the first layer is formed from an amorphous material (example, at least one material selected from the group consisting of amorphous ferromagnetic materials, amorphous ferrimagnetic materials and amorphous non-ferromagnetic or non-ferrimagnetic materials). The interface layer is formed from a material that is crystalline when the material is in isolation from both the tunnel barrier layer and the first layer.

A second layer, formed from at least one material selected from the group consisting of ferromagnetic materials and ferrimagnetic materials, can be formed in contact with the tunnel barrier layer. Accordingly, the first layer, the interface layer, the tunnel barrier layer, and the second layer together form a magnetic tunnel junction having a tunneling magnetoresistance that is greater than 50%.

Alternatively, a metal-containing layer can be formed in contact with the tunnel barrier, and a semiconductor layer can be formed that is in contact with the first layer. The metal-containing layer includes a metallic layer formed from at least one of a non-ferromagnetic material and a non-ferrimagnetic material. The metal-containing layer, the tunnel barrier, the interface layer, the first layer and the semiconductor layer together form a magnetic tunneling transistor.

As yet another alternative, a semiconductor material layer can be formed in contact with the tunnel barrier layer. The semiconductor layer, tunnel barrier layer, the interface layer and the first layer together form a spin-injector device.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE INVENTION

The present invention provides MTJ structures having $Al_2O_3$ tunnel barriers exhibiting TMR of nearly 70%. According to the present invention, one layer of an MTJ element is formed from the class of ferromagnetic (FM) materials of the form CoFeX or CoFeXY in which the dopants X and Y are chosen from B, Hf, Zr, C, Be, Si, Ge, P and Al, or combinations of two or more of these elements. Use of a thin interface layer of CoFe along with these CoFeX and CoFeXY alloys significantly enhances the TMR of an MTJ element according to the present invention. The enhanced TMR values together with excellent magnetic-switching characteristics (high AQF values) make CoFeX and CoFeXY alloys with CoFe interface layers extremely attractive for MRAM applications as well as other applications, for example, magnetic recording read heads, in which high TMR values are needed in comparatively low magnetic fields. The layers of an MTJ device according to the present invention show very good thermal stability, sufficient to survive typical MRAM processing thermal budgets. Using an appropriate choice of CoFe and CoFeX or CoFeXY, the layers are stable to temperatures that are typically greater than 400 C.

Figure 1:
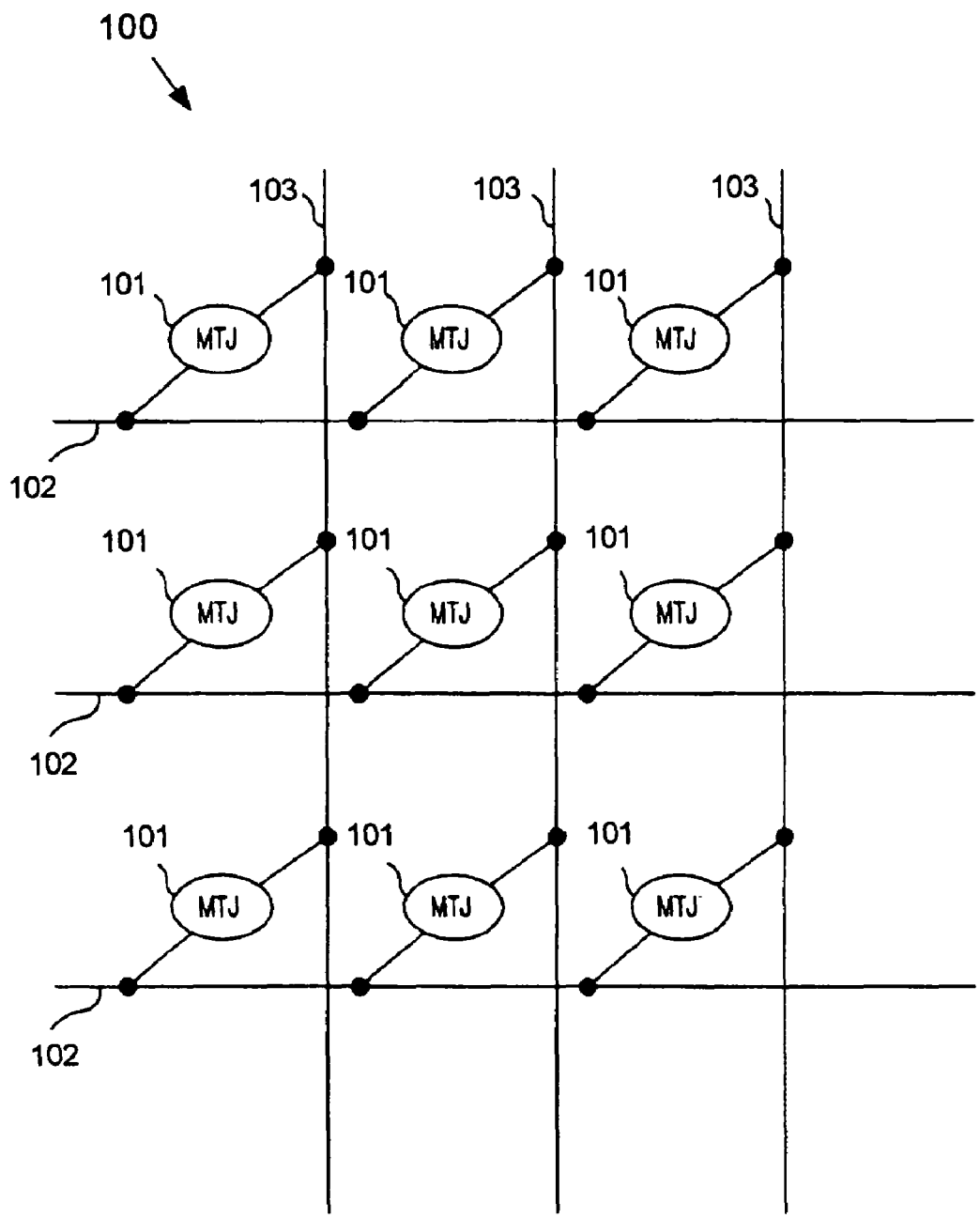
FIG. 1 depicts an exemplary cross-point array 100 of an MTJ-MRAM.
Figure 2:
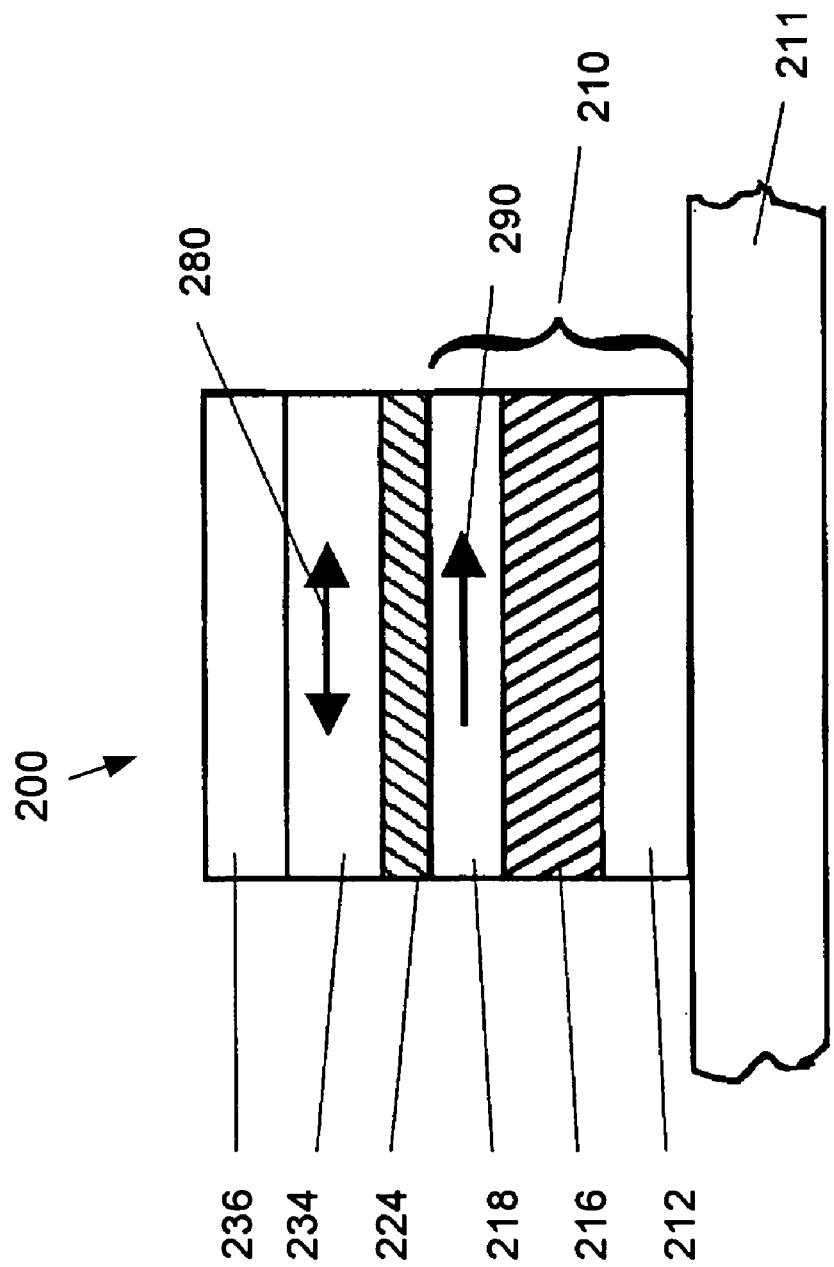
FIG. 2 depicts a cross-sectional diagram of an exemplary structural arrangement of a conventional magnetic tunnel junction.

FIG. 2 depicts a cross-sectional diagram of an exemplary structural arrangement of a conventional MTJ device 200. A typical conventional MTJ structure includes a seed layer, an anti-ferromagnetic exchange-bias layer, a reference ferromagnetic electrode, a tunnel barrier, a storage, or "free," ferromagnetic layer and a cap layer. In particular, MTJ element 200 includes a bottom "fixed" ferromagnetic (F) layer 218, an insulating tunnel barrier layer 224, and a top "free" ferromagnetic layer 234. MTJ 200 has bottom and top electrical leads 212 and 236, respectively, with bottom lead 212 being formed on a suitable substrate 211, such as a silicon oxide layer. Ferromagnetic layer 218 is called the fixed layer because its magnetic moment is prevented from rotating in the presence of an applied magnetic field in the desired range of interest for a MTJ device, e.g., the magnetic field caused by a write current applied to the memory cell from the read/write circuitry of the MRAM or the magnetic field from the recorded magnetic layer in a magnetic recording disk. The magnetic moment of ferromagnetic layer 218, the direction of which is indicated by arrow 290 in FIG. 2, can be fixed by forming ferromagnetic layer 218 from a high coercivity magnetic material or by exchange-coupling ferromagnetic layer 218 to an antiferromagnetic layer 216. The magnetic moment of free ferromagnetic layer 234 is not fixed, and is thus free to rotate in the presence of an applied magnetic field in the range of interest. In the absence of an applied magnetic field, the respective moments of ferromagnetic layers 218 and 234 are aligned generally parallel (or anti-parallel) in an MTJ memory cell (as indicated by double-headed arrow 280 in FIG. 2) and generally perpendicular in a MTJ magnetoresistive read head. The relative orientation of the respective magnetic moments of ferromagnetic layers 218 and 234 affects the tunneling current and, thus, the electrical resistance of the MTJ device. Bottom lead 212, antiferromagnetic layer 216, and fixed ferromagnetic layer 218 together may be regarded as constituting a lower electrode 210.

Conventional MTJ devices have been prepared on silicon substrates with 250 Å thick thermally oxidized $SiO_2$ in a high-vacuum chamber having a base pressure of $\sim 2 \times 10^{-9}$ Torr. The layers were sequentially deposited by magnetron sputtering in ~3 mTorr of Argon (although a range of sputtering pressures was also used). In order to explore the properties of a wide range of MTJ structures and materials, MTJ devices have been patterned using metal shadow masks. A sequence of three metal shadow masks has been used, without breaking vacuum, to define the bottom electrode, the tunnel barrier and the top electrode. The junction area for these MTJ devices was ~80×80 $\mu m^2$.

Such a conventional MTJ structure, shown in FIG. 2, in which the reference ferromagnetic layer, i.e., layer 218, is fixed by exchange bias with an antiferromagnetic layer, has been referred to as a "simple-pinned" MTJ. The reference layer is formed from a FM layer, which can be a single ferromagnetic layer or a stack of multiple ferromagnetic layers. The reference layer could alternately be an "artificial antiferromagnet (AAF)" in which the FM layer is replaced by a sandwich of two thin FM layers that are separated by an antiferromagnetic (AF) coupling spacer layer formed from a non-ferromagnetic conducting material, most commonly Ru or Os. See, for example, U.S. Pat. No. 5,841,692 to Gallagher et al. The thickness of the spacer layer is chosen so that the two FM layers are strongly AF exchanged coupled, thereby ensuring that the magnetic moments of the two ferromagnetic are aligned anti-parallel to one another. See, for example, U.S. Pat. No. 5,341,118 to Parkin et al. Such an AAF structure provides greater magnetic stability for the reference layer and also can be used to control the coupling via magnetostatic fields at the edges of this layer to the storage layer, as described in U.S. Pat. No. 5,465,185 to Parkin et al.

For conventional MTJ 200, underlayer 212 and cap layer 236 are each typically formed from 50 Å TaN/50 Å Ta, although these thicknesses have been varied over a wide range. The TaN layer has been deposited in a manner consistent with previously established procedures and, in particular, by reactive sputtering of Ta in an Ar—$N_2$ gas mixture, such as described in U.S. Pat. No. 6,518,588 to Parkin et al. The AF layer is formed from ~150-250 Å Ir—Mn in which the Ir content of the alloy is in the range 20 to 30 atomic percent. Other AF materials can also be used including Pt—Mn, Os—Mn, Ni—Mn, Pd—Mn, Os—Ir—Mn, CrPtMn, etc. For simple pinned MTJs, fixed FM layer 218 is ~35 Å $Co_{70}Fe_{30}$ and for MTJs having AAF reference layers, the AAF layer is ~20 Å FM/x Ru/17 Å FM, with x in the range from 6 to 11 Å, which gives rise to AF coupling of the FM layers. The tunnel barrier is formed by depositing 22 Å Al, which is subsequently plasma oxidized in ~100 mTorr oxygen to form an $Al_2O_3$ barrier. Other methods could be used to form tunnel barrier 224, including reactive sputtering of Al in an Ar+$O_2$ mixture or by natural oxidation of metallic Al. Storage layer 234 is 75 Å thick.

The magnetic and magneto-transport properties of simple pinned MTJs having FM storage layers that are formed from an extensive range of B-doped CoFe alloys have been explored. Crystalline Co—Fe alloys are well known to become amorphous when B is added to these alloys in the range of ~10-25 atomic percent. See, for example, A. R. Ferchmin et al., Amorphous Magnetism and Metallic Magnetic Materials Digest, North Holland Publishing Company, New York (1983). The TMR of the MTJs depends on both the B and the Co—Fe composition of the alloy. For CoFeB alloys, with B contents of between 15 and 20 atomic percent, the TMR increases as the Fe content of the CoFe alloy increases from ~10 to ~30 atomic percent. For an CoFeB alloy with a Co:Fe ratio of 70:30 the maximum TMR was found for a B content of ~15%.

The highest TMR for MTJs having CoFeB alloy storage layers was found to be the alloy with composition $(Co_{70}Fe_{30})_{85} B_{15}$ for which the TMR is ~62% at room temperature. This value is significantly higher than found for MTJs containing storage layers formed from crystalline Co—Fe alloys, for which the maximum TMR observed was ~55%.

The magnetic switching properties of CoFeB alloys have been examined by carrying out AQF studies on lithographically patterned arrays of magnetic nanoelements with structures of the type: 50 Å TaN|50 Å Ta|10 Å Al plasma oxidized|t CoFeB alloy|100 Å TaN in which the thickness of the storage layer t was varied in the range 20-100 Å. These structures include only the storage layer and so allow for the determination of AQF factors without regard to the reference layer. The dependence of the AQF on storage layer thickness allows surface contributions to be distinguished from volume effects. The MJT storage elements in these studies were of an elliptical shape and were of ~0.3×0.6 μm in size. Arrays of $(Co_{70}Fe_{30})_{1-x}B_x$ elements displayed AQF values of ~20 at a switching field of ~100 Oe, which meets the write yield requirements for MRAM arrays. Typically, much higher AQF values were found for structures having amorphous CoFeB storage layers than for otherwise identical arrays of magnetic nanoelements with storage layers that were formed from crystalline CoFe alloys. Thus, amorphous free layers have considerable advantages for MRAM storage cells.

CoFe and other 3d transition metal ferromagnets can be made amorphous by adding one or more of a range of non-magnetic elements, including B, Hf, Zr, C, Be, Si, Ge, P and Al. In particular, MTJs have been studied in which the storage layer was formed from various alloys of the form CoFeXY, in which X and Y are chosen from B, Hf, Zr, C, Be, Si, Ge, P and Al. The CoFeXY alloys become amorphous when the concentration of X and/or Y exceed a critical value, which depends on various factors, including the nature of the underlayer (in this case, tunnel barrier $Al_2O_3$), and the overlayer (in this case, cap layer TaN), as well as the thickness of the CoFeXY layer and the temperature at which the layer is deposited or subsequently is subjected to. The CoFeXY layer, if amorphous, will typically undergo an amorphous to crystalline transition at some critical temperature that is sensitive to the concentration of X and Y, as well as to the underlayer and cap layer, and the thickness of the CoFeXY layer. Thus the amorphous state is typically not the thermodynamically lowest energy state but is rather a metastable state.

Figure 3:
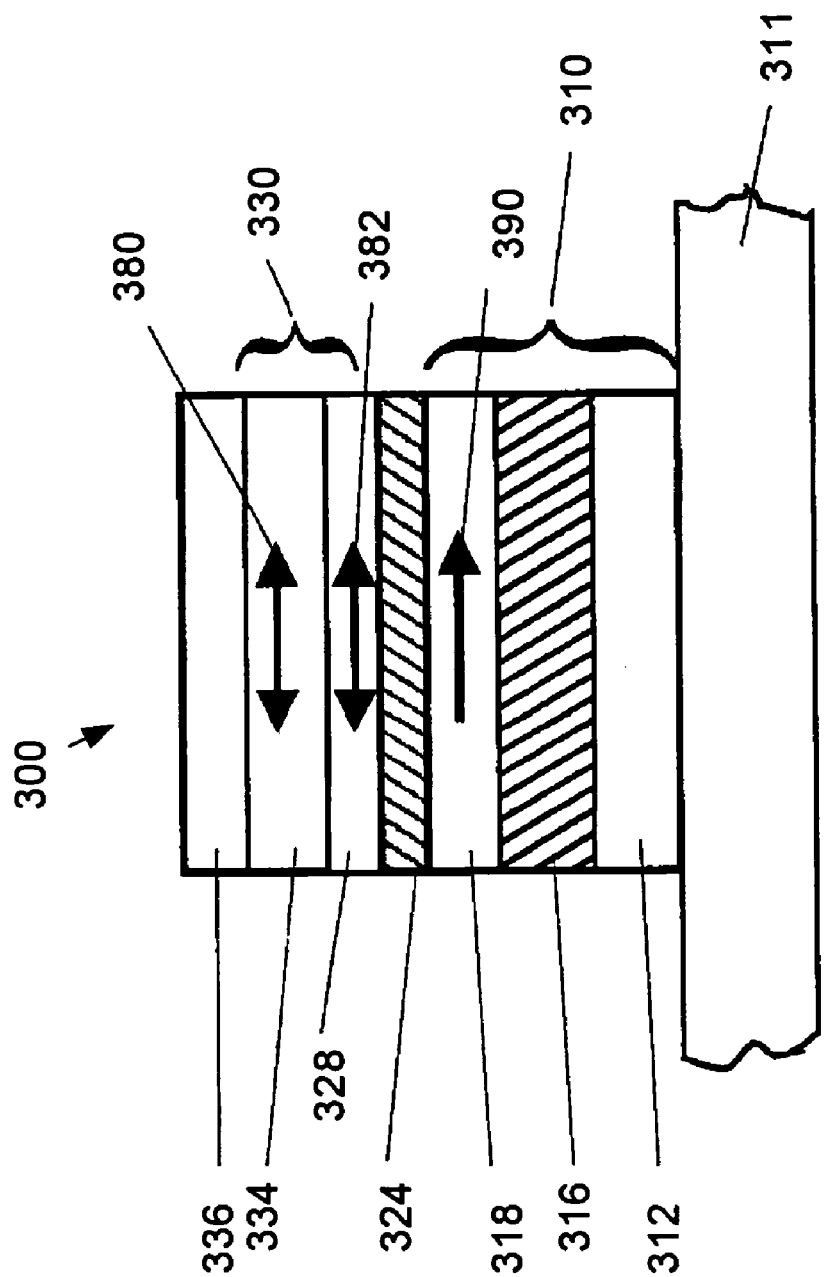
FIG. 3 depicts a cross-sectional diagram of an exemplary structural arrangement of an MTJ element having a thin interface layer of CoFe inserted between a tunnel barrier and a layer of amorphous material.
Figures 4A, 4B:
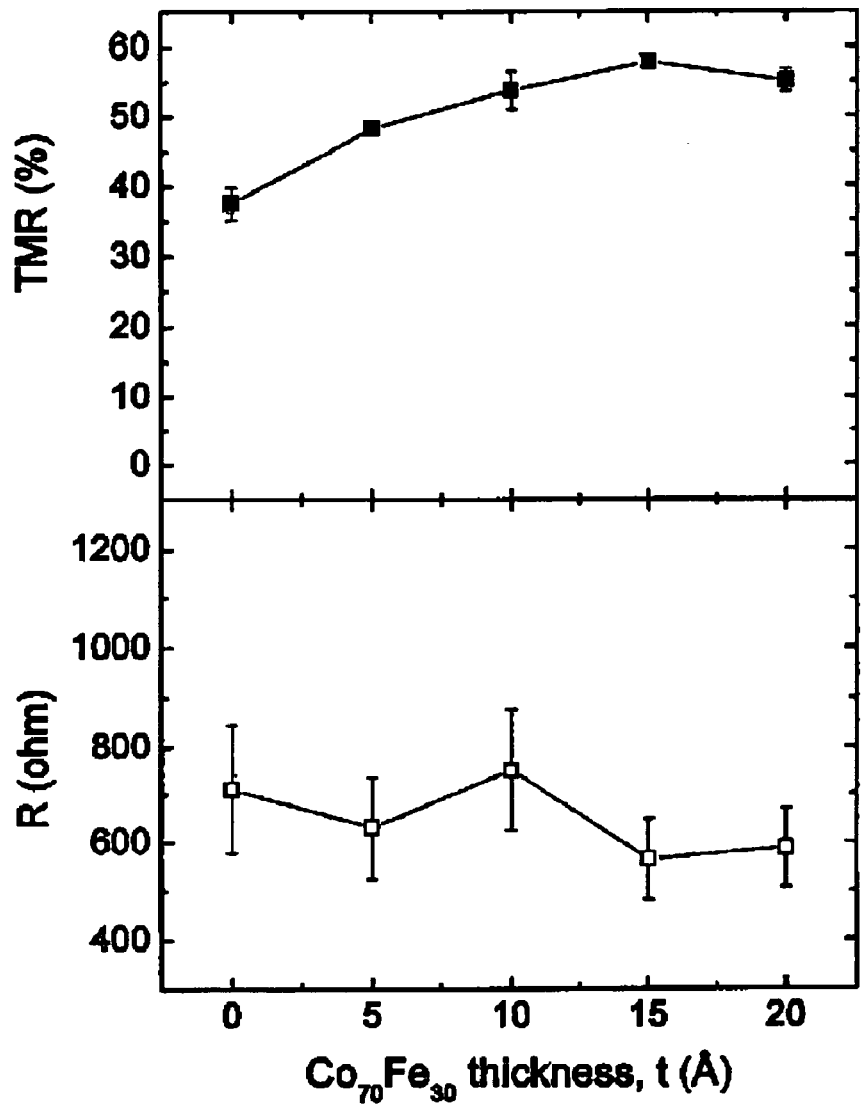
FIGS. 4A and 4B are graphs respectively showing the TMR and resistance for an exemplary MTJ element according to the present invention as a function of the thickness of an interface CoFe layer that is between an $Al_2O_3$ insulating barrier and a CoFeHfB layer.

MTJs having CoFeXY storage layers in which X and Y are not boron display lower TMR values those found than for CoFeB or for crystalline CoFe layers. For example, MTJs with $(Co_{70}Fe_{30})_{85}Zr_{15}$ storage layers show TMR values of up to 45-50% which are nearly the same as crystalline CoFe layers. On the other hand MTJs with $(Co_{70}Fe_{30})_{80}Si_{20}$ show TMR values of only ~25-30%, which are much lower than those found for crystalline CoFe storage layers. Because, however, amorphous storage layers have significant benefits with respect to magnetic switching uniformity and control, studies have been carried out in which a thin interface layer of CoFe was inserted between the tunnel barrier and the CoFeXY storage layer. In particular, FIG. 3 depicts a cross-sectional diagram of an exemplary structural arrangement of an MTJ element 300 according to the present invention having a thin interface layer of CoFe inserted between a tunnel barrier and a layer of amorphous material. MTJ element 300 includes an antiferromagnetic layer 316, a bottom "fixed" ferromagnetic (or ferrimagnetic) (F) layer 318, an insulating tunnel barrier layer 324, a thin interface layer of CoFe 328, and a top "free" ferromagnetic layer 334. MTJ element 300 has bottom and top electrical leads 312 and 336, respectively, with bottom lead 312 being formed on a suitable substrate 311, such as a silicon oxide layer. The exemplary structure for MTJ 300 provides TMR values that are much higher than those obtained for storage layers formed only from CoFe or from a CoFeXY alloy, as illustrated in FIGS. 4A and 4B for the case of X=Hf and Y=B. Thus, according to the present invention, the introduction of thin, nominally crystalline, CoFe layers at the interface between CoFeXY alloy 334 and $Al_2O_3$ tunnel barrier 324 significantly increases the tunneling magnetoresistance and gives rise to higher TMR values than are possible with either crystalline CoFe alloys or amorphous CoFeXY alloys, alone.

FIGS. 4A and 4B are graphs respectively showing the TMR and resistance (R) for an exemplary MTJ element according to the present invention as a function of the thickness of an interface CoFe layer that is placed in contact with an $Al_2O_3$ insulating barrier under a CoFeHfB storage layer. Specifically, FIGS. 4A and 4B show the average TMR and resistance, respectively, of ten MTJs formed by shadow masks, each having an area of ~80×80 µm² and the corresponding error bars show the distribution of TMR and R (±1σ). Sample MTJ devices having the exemplary structure shown in FIG. 3 were sputter deposited onto silicon oxide layers 311 formed on a silicon substrate. Underlayer 312 is formed from a bilayer of 50 Å TaN and 50 Å Ta in which these layers are deposited by magnetron sputtering in ~3 mTorr of Argon at nominally room temperature by first reactively sputtering a layer of Ta in an Ar—$N_2$ gas mixture with ~10% $N_2$ followed by sputtering of Ta in pure Argon. An antiferromagnetic exchange bias layer 316 of 150 Å IrMn, in which the Ir content is ~28 atomic percent Ir, is subsequently formed on top of Ta layer 312. A fixed ferromagnetic layer 318 is formed from 35 Å $Co_{70}Fe_{30}$. Tunnel barrier 324 is formed by first depositing a layer of Al metal 22 Å thick, which is then plasma oxidized in 100 mTorr oxygen for 240 seconds. Storage layer 330 is formed from a bilayer of CoFe and CoFeHfB. CoFe interface layer 328 is formed from an alloy of composition $Co_{70}Fe_{30}$ having a thickness t in the range from zero up to 20 Å. Amorphous ferromagnetic layer 334 is formed from an alloy of $(Co_{70}Fe_{30})_{80}Hf_{10}B_{10}$ in which the layer contains about 10 atomic percent of both Hf and B. The CoFe content of layer 334 has about 30 atomic percent Fe. The total thickness of storage layer 330 is maintained at ~75 Å so that layer 334 has a thickness of (75-t) Å. Finally, cap layer 336 is formed from a bilayer of 50 Å TaN and 50 Å Ta. The MTJs are then annealed at 280 C for 90 minutes in a field of 1 T to set the exchange bias and so fix the moment direction of the fixed layer 318.

Figure 5:
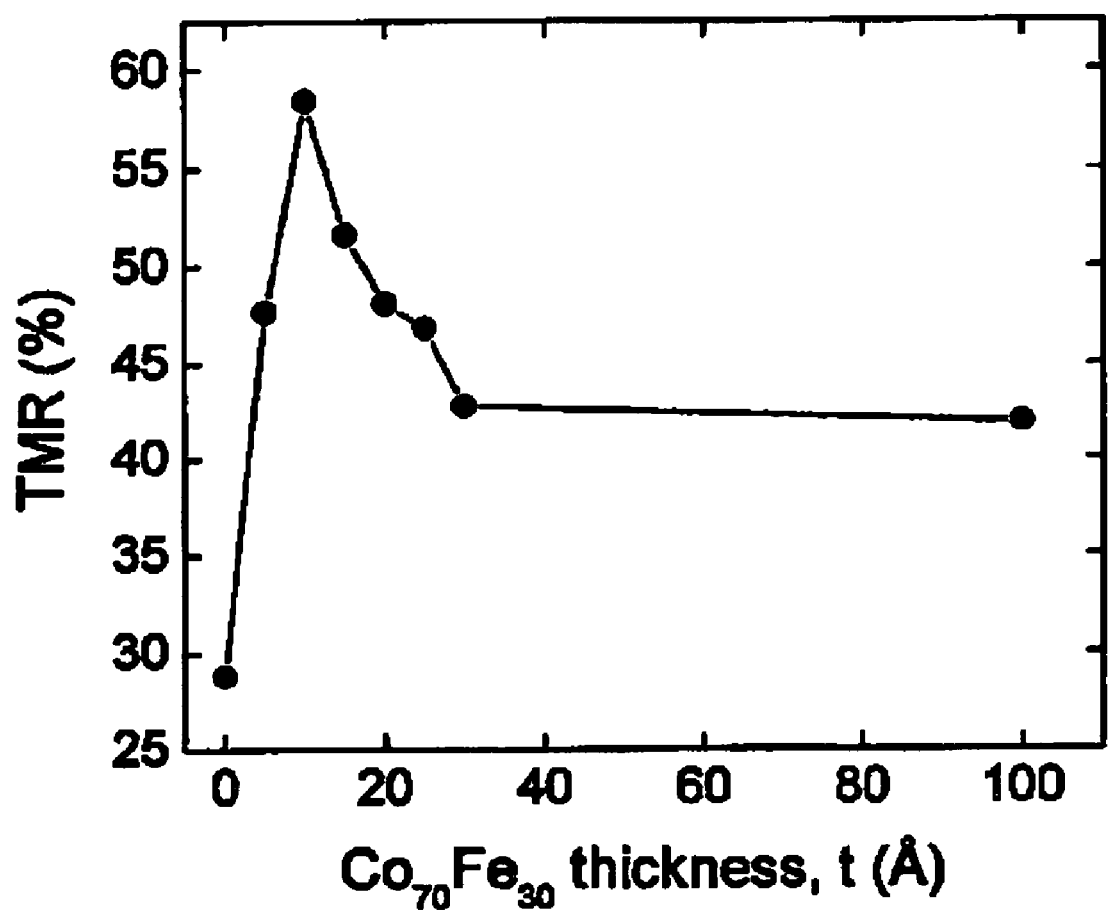
FIG. 5 is a graph showing TMR as a function of thickness of an interface layer formed from $Co_{70}Fe_{30}$ and an amorphous layer formed from a B-doped $Co_{70}Fe_{30}$ layer according to the present invention.

FIG. 4A shows that the TMR for MTJ elements having no interface layer 328 (i.e., thickness equals 0) is low (~38%), but that the TMR increases substantially with the inclusion of a CoFe interface layer 328 that is only 5 Å thick. As the interface layer thickness is further increased, the TMR also increases and reaches a maximum value for a CoFe interface thickness of ~10-15 Å. FIG. 4B shows that, even though the TMR varies substantially with the thickness of interface layer 328, the resistance of the MTJ devices is not very sensitive to the presence and thickness of the interface layer. The dependence of TMR and R shown in FIGS. 4A and 4B are typical for the family of amorphous CoFeXY ferromagnetic materials, although the magnitude of the TMR varies depending on the detailed composition of CoFeXY. FIG. 5 is a graph showing TMR as a function of thickness of an interface layer 328 formed from $Co_{70}Fe_{30}$ and the amorphous layer 334 is formed from a B-doped $Co_{70}Fe_{30}$ layer such that the B concentration is 10 atomic percent. In contrast to FIG. 4A, layer 334 has a constant thickness of 100 Å for all the MTJ element samples shown in FIG. 5. There are other minor differences as well, such as the underlayer for the MTJs of FIG. 5 was formed from 100 Å Ta without a TaN layer and the IrMn layer had a thickness of ~250 Å. Cap layer 336 was formed from a bilayer of 50 Å TaN and 75 Å Ta. Notwithstanding these small structural differences, the basic results are similar by exhibiting strongly enhanced TMR values in comparison to the TMR values of conventional MTJs having storage layers formed from either the CoFeB alloy only (i.e., t=0) or only CoFe (i.e., no amorphous layer 334). In particular, the TMR is increased for a range of thickness of CoFe interface layer 328 from ~5 to 25 Å. This range of thickness depends on the composition of layers 328 and 334.

Figures 6A, 6B:
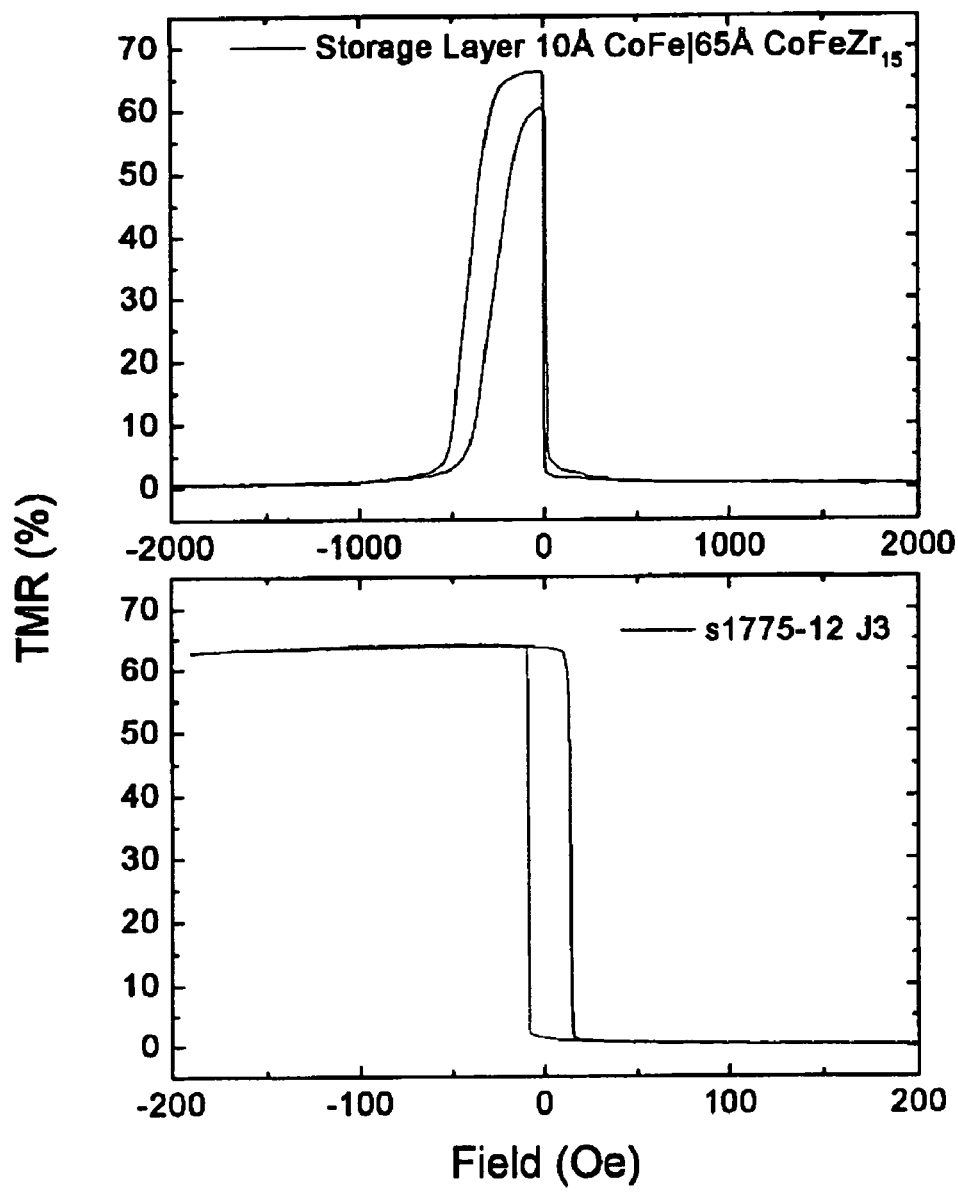
FIGS. 6A and 6B are graphs respectively showing resistance versus field loops for the same MTJ sample subjected to fields varying between ±2000 Oe in the plane of the sample and to fields between ±200 Oe in the plane of the sample, where the sample has an interface layer formed from CoFe and an amorphous ferromagnetic layer formed from CoFeZr.

MTJs having storage layers formed from bilayers of CoFe and CoFeZr have the highest TMR values of nearly 70% amongst the various combinations of interface layers 328 and storage layers 334 that were considered. Typical data for such devices are shown in FIGS. 6A and 6B in which resistance versus field loops are shown for the same MTJ sample, but subjected to fields varying between ±2000 Oe in the plane of the sample in FIG. 6A and to fields between ±200 Oe in the plane of the sample in FIG. 6B. The exemplary structural configuration of the MTJ device for FIGS. 6A and 6B is 50 Å TaN/50 Å Ta/150 Å IrMn/35 Å $Co_{70}Fe_{30}$/22 Å Al plasma oxidized for 240 seconds/10 Å $Co_{70}Fe_{30}$/65 Å$(Co_{70}Fe_{30})_{85}Zr_{15}$/100 Å TaN/100 Å Ta. Interface layer 328 (FIG. 3) is formed from 10 Å $Co_{70}Fe_{30}$ and amorphous layer 334 is formed from 65 Å $(Co_{70}Fe_{30})_{85}Zr_{15}$. The TMR obtained for this exemplary structural configuration was ~67%, which is the highest TMR yet reported for any MTJ sample having an $Al_2O_3$ barrier. The minor loop shown in FIG. 6B has a square shape indicating excellent switching characteristics for this storage layer. Note that the coercivity of the storage layer for this structural configuration is significantly lower than that for a storage layer of $Co_{70}Fe_{30}$ alone and is similar to that for $(Co_{70}Fe_{30})_{85}Zr_{15}$ without any CoFe interface layer.

Figures 7A, 7B:
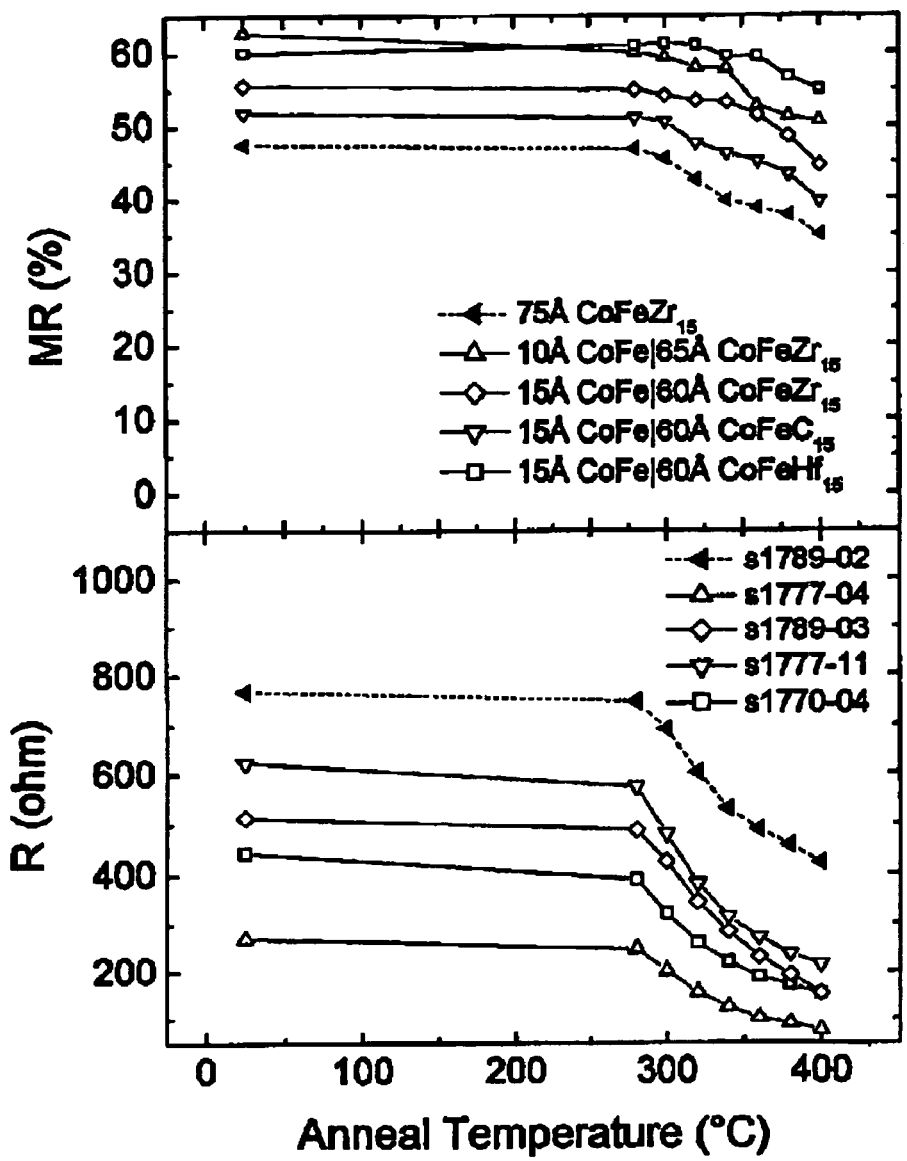
FIGS. 7A and 7B are graphs respectively showing representative thermal stability for TMR and resistance for MTJ devices with CoFeX and CoFe/CoFeX layers in which CoFeX is $(Co_{70}Fe_{30})_{85}Zr_{15}$, $(Co_{70}Fe_{30})_{85}Hf_{15}$, and $(Co_{70}Fe_{30})_{85}C_{15}$.

The successful integration of MTJs into MRAM requires that the MTJ devices survive whatever is the integrated thermal anneal budget as determined by the various processing steps to define the MRAM chip. Thus, an important property of MTJ devices having CoFeX and CoFe/CoFeX storage layers is their thermal stability. Representative results are shown in FIGS. 7A and 7B for CoFeX and CoFe/CoFeX in which CoFeX is $(Co_{70}Fe_{30})_{85}Zr_{15}$, $(Co_{70}Fe_{30})_{85}Hf_{15}$, and $(Co_{70}Fe_{30})_{85}C_{15}$. FIGS. 7A and 7B are graphs respectively showing representative thermal stability for TMR and resistance for MTJ devices according to the present invention having CoFeX and CoFe/CoFeX layers in which CoFeX is $(Co_{70}Fe_{30})_{85}Zr_{15}$, $(Co_{70}Fe_{30})_{85}Hf_{15}$, and $(Co_{70}Fe_{30})_{85}C_{15}$. The thermal stability measurements were carried a specially designed annealing furnace having a high-vacuum chamber with a base pressure of $5\times10^{-8}$ torr and capable of heating an MTJ sample to 400 C in presence of an applied field of up to 4000 Oe. The annealing measurement displayed in FIGS. 7A and 7B consisted of a sequential series of ramp, soak, cool, and transport measurement steps. Typically, the sample temperature was ramped to the chosen anneal temperature at a ramp rate of ~10 C/minute and soaked at this temperature for ½ hour, then cooled to 25 C. The transport properties were then measured at 25 C. This was followed by the next temperature step. FIGS. 7A and 7B also include data on the thermal stability of MTJs having CoFe/$(Co_{70}Fe_{30})_{85}Zr_{15}$ storage layers for various CoFe interface layer thicknesses. These results show that the variation of TMR and R with anneal temperature are not very sensitive to the presence and thickness of the CoFe interface layer. For all of the examples shown in FIGS. 7A and 7B having CoFe interface layers, excellent thermal stability is found with significant TMR of >45% even after annealing for ½ hour at 400 C.

CoFeXY layers are amorphous when the amount of X and/or Y exceeds some critical value. The thermal stability of the MTJs containing these amorphous layers is limited by the crystallization temperature of the amorphous CoFeXY alloy. Typically, the crystallization of the a-FM layers results in a dramatic increase in coercivity of the storage layer and a corresponding drop in TMR. The crystallization temperature is strongly influenced by the concentration of the dopants X and Y and typically was found to increase significantly with increasing amount of X and Y. The TMR, however, often drops when the dopant concentration X and Y is increased beyond some value. Thus, for MTJs having amorphous ferromagnetic storage layers and no interface layer 328 (FIG. 3), a compromise must be made between higher crystallization temperatures and, thereby, higher thermal stability or higher TMR. With the presence of interface layer 328, no such compromise must be made because the magnitude of TMR is largely determined by the properties of interface layer 328. Thus, layer 334 can be formed from amorphous alloys that have very high crystallization temperatures—much higher than those that the MTJ stack will be subjected to during the fabrication of the MTJ devices. For example, when the MTJ devices are incorporated into the back-end-of-line (BEOL) of a CMOS technology, the devices will likely be subjected to thermal treatments in the range of 400 to 450 C. Thus, the crystallization temperature of the CoFeXY alloys must be above these temperatures. If the MTJs are the memory storage cells in an embedded memory, then these devices may have to withstand even higher temperatures.

Note the crystallization temperature of a-FM layer 334 may be strongly influenced by the material and composition and thickness of cap layer 336. The highest crystallization temperatures were obtained with TaN cap layers. Similar MTJ structures having Ta or TaCr cap layers (the latter are amorphous) exhibit much lower crystallization temperatures. For TaCr, this was due to the comparatively low crystallization temperature of TaCr.

The TMR of MTJs is determined by, in large part, by the spin polarization of the conduction electrons of the FM layers on either side of the tunnel barrier. See, for example, M. Julliere, Phys. Lett. 54A, 225 (1975). The spin polarization is defined as the difference in density of states (DOS) of spin up and spin down electrons at the Fermi energy divided by the total DOS at the Fermi energy. Thus, the increased TMR found for thin CoFe interface layers could be a result of an increase in the spin polarized density of states in this layer. One possibility is that electrons are confined in this thin interface layer because of a mis-match in the band structures of ferromagnetic interface layer 328 and ferromagnetic amorphous layer 334. The band structures of insulating tunnel barrier 324 and metallic interface layer 328 are clearly mis-matched because of the large band gap in the $Al_2O_3$ insulating layer. Confinement, however, in metallic non-ferromagnetic interface layers gives rise to a diminished TMR and not an enhanced TMR. See, for example, S. Yuasa et al., "Spin polarized resonant tunneling in magnetic tunnel junctions", Science 297, 234 (2002). Moreover, a more likely explanation is revealed by cross-sectional transmission electron microscopy (XTEM) studies that show that for the range of thickness of the CoFe interface layer for which the TMR is enhanced, the CoFe layer is unexpectedly amorphous in structure. As used herein amorphous means the absence of crystalline order on larger length scales (for example, the absence of any obvious granularity, such as crystalline grains) but does not necessarily exclude the possibility of nano-crystallinity on very short length scales (such as atomic length scales). Usually CoFe is crystalline for the whole composition range of Co—Fe alloys from pure Co to pure Fe. Moreover, for CoFe interface layers thicker than about ~20 Å, XTEM studies reveal that the CoFe structure reverts to being crystalline. Thus, CoFe interface layer 328 becomes amorphous in structure when layer 328 is very thin, presumably due to its contact with the amorphous $Al_2O_3$ tunnel barrier on one of its surfaces and the amorphous ferromagnetic layer 334 on its other surface. Thus, there is a clear correlation between enhanced TMR and the amorphous structure of thin CoFe interface layers. This hypothesis is confirmed by soft resonant emission x-ray spectroscopy studies on bilayers of CoFe/CoFeB grown on $Al_2O_3$ that reveal additional structure in the energy dependence of the density of states at the Fermi Energy of this metallic bilayer for thin CoFe interface layers. In particular, a sharp feature in the Fe 3d local density of states is found for thin CoFe layers over the same range of thickness for which the TMR is enhanced and the structure is found to be amorphous. Interestingly, no such feature is found in the Co 3d density of states. Thus, the enhanced TMR can be attributed to an enhancement of the local Fe 3d density of states, which itself is a result of the amorphization of thin CoFe layers. Thus, a technique for enhancing the TMR of MTJs is revealed by these observations. By taking nominally crystalline ferromagnetic metals and making such metals amorphous, their density of states can be enhanced leading to enhanced TMR values. According to the present invention, the amorphization is carried out by sandwiching thin ferromagnetic films between materials, which are amorphous. It may also be possible to induce an amorphous structure to thin ferromagnetic layers by other techniques that might include rapid quenching of the structure of the thin film, by, for example, depositing a ferromagnetic film at very low temperatures onto tunnel barrier 324. Amorphization might also be possible by bombarding the ferromagnetic layer, after deposition, with energetic ions.

The high TMR of the MTJ device shown in FIG. 3 results from the high-spin polarization of ferromagnetic layer 328 at the interface with amorphous tunnel barrier 324. The high-spin polarization results from the amorphization of normally crystalline ferromagnetic alloys. In a simple description, the randomization of the crystal structure of the alloy can be considered to result in a reduction in the effective number of bonds between individual atoms in the alloy thereby leading to a narrower conduction band, an increase in the density of states at the Fermi energy and to a higher spin polarization. What is needed is the amorphization of interface layer 328, which is achieved by sandwiching a normally crystalline material between two amorphous layers, that is, tunnel barrier layer 324 and amorphous ferromagnetic layer 334. Note that layer 334 does not need to be ferromagnetic and, indeed, for some applications it may be advantageous to form layer 334 from a material that is non-ferromagnetic to reduce the total magnetic moment of storage layer 330. Because the magnetization of the storage layer couples to the magnetization of the reference layer through magnetostatic coupling at the edges of patterned elements, it is often useful to reduce this effect by reducing the respective magnetic moments of these layers. For example, layer 334 can be formed from alloys of Co and Fe, which are made non-magnetic by the addition of sufficiently high quantities of B or Zr or Hf or other elements that make the layer amorphous. It may be advantageous to form layer 334 from non-magnetic alloys containing Co and Fe because these layers in conjunction with CoFe interface layers 324 are likely to be more thermally stable than alloys that are more dissimilar from the alloy forming interface layer 324.

Layer 334 can be formed from other amorphous ferromagnetic alloys including alloys of Co and Fe with rare-earth elements such as Gd or Tb.

Although the preferred embodiment of the current invention has been described with regard to a tunnel barrier layer 324 formed from an amorphous layer of $Al_2O_3$, the tunnel barrier can also be formed from other amorphous materials including, for example, $Ga_2O_3$ and $In_2O_3$ and related materials. See, for example, U.S. Pat. No. 6,359,289 to Parkin.

Figure 8:
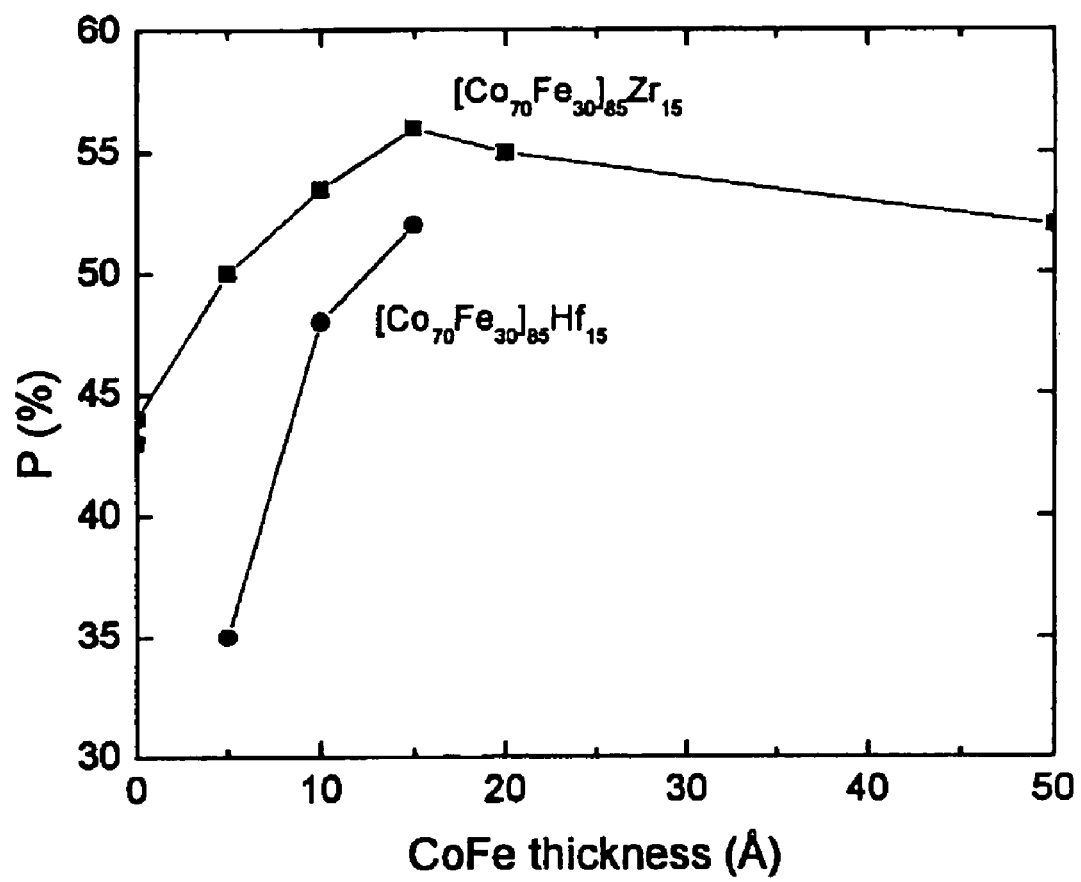
FIG. 8 is a graph showing values of spin polarization as a function of the thickness of a CoFe interface layer for a magnetic tunneling element with CoFe interface layers and an amorphous ferromagnetic layer formed from a $(Co_{70}Fe_{30})_{85}$ $Zr_{15}$ alloy and a $(Co_{70}Fe_{30})_{85}Hf_{15}$ alloy.

High TMR values are obtained in MTJs by using thin interface layers of CoFe alloys 328 that are made amorphous by sandwiching these layers between an amorphous tunnel barrier 324 and an amorphous metallic layer 334. The high TMR follows from the high spin polarization of the tunneling current that can be directly measured using the technique of superconducting tunneling spectroscopy in which lower electrode 310 is replaced by a thin superconducting layer of Al. See, for example, R. Meservey et al., Phys. Rep. 238, 173 (1994). FIG. 8 is a graph showing values of spin polarization P as a function of the thickness of CoFe interface layer 324 for a structure comprised of 45 Å Al/14 Å Al plasma oxidized for 180 or 240 seconds/t $Co_{70}Fe_{30}$/300 Å $(Co_{70}Fe_{30})_{85}Zr_{15}$ or 300 Å $(Co_{70}Fe_{30})_{85}Hf_{15}$ for t ranging from zero to 50 Å for the $(Co_{70}Fe_{30})_{85}Zr_{15}$ alloy and from zero to 15 Å for the $(Co_{70}Fe_{30})_{85}Hf_{15}$ alloy. As shown in FIG. 8, the polarization P attains values of about 56% for thicknesses of $Co_{70}Fe_{30}$ in the range from 15 to 20 Å, which is consistent with the high values of TMR observed in MTJs for $Co_{70}Fe_{30}$ interface layers 328 in this thickness range.

Although the preferred embodiment has been described with respect to an MTJ with a storage or free ferromagnetic layer formed from an interface layer of a nominally crystalline ferromagnetic or ferromagnetic material and an amorphous layer formed from a non-magnetic, ferromagnetic or ferromagnetic material, the improved magnetic tunneling element of the current invention can also be used in an inverted MTJ structure in which the storage layer is formed below the tunnel barrier and the fixed layer is formed above the tunnel barrier. Similarly, the improved magnetic tunneling element of the current invention may be used both for the storage (or free) layer as well as the fixed layer so that the MTJ would be comprised of a first layer formed from one or more of the group of amorphous materials comprised of non-magnetic materials, ferromagnetic materials and ferromagnetic materials; a first interface layer formed from one or more of a ferromagnetic or ferromagnetic material which is typically crystalline in isolation of the first layer; an amorphous tunnel barrier which is formed on top of this first interface layer; and a second interface layer, formed from one or more of a ferromagnetic or ferromagnetic material which is typically crystalline in isolation; and a second layer, formed from one or more of the group of amorphous materials comprised of non-magnetic materials, ferromagnetic materials and ferromagnetic materials.

Figure 9A:
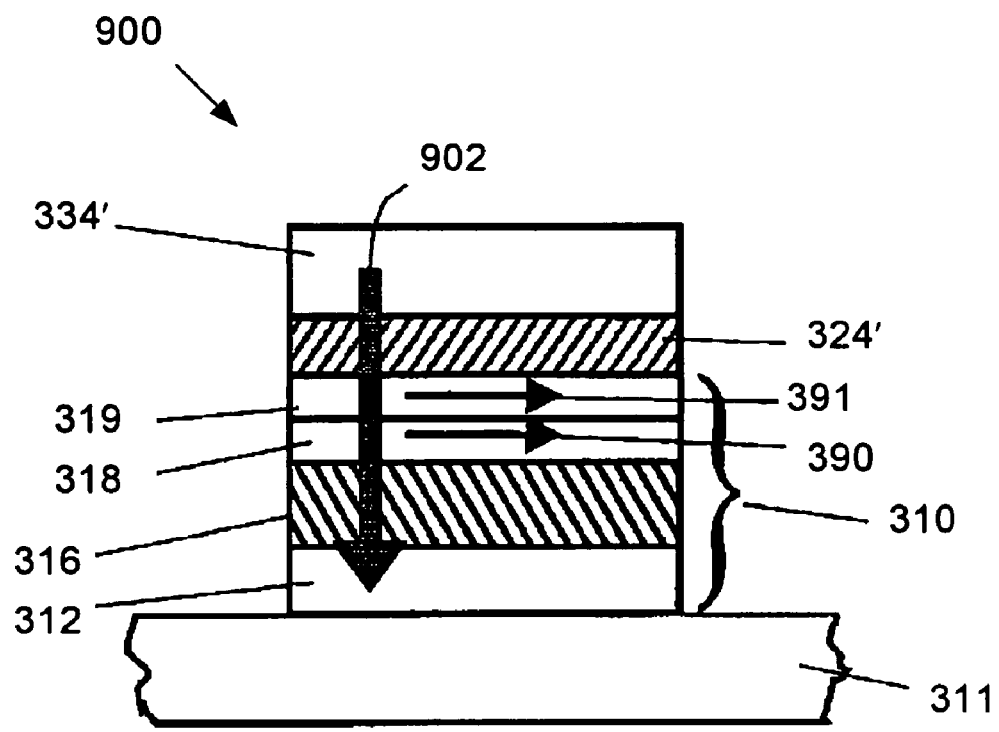
FIGS. 9A-9C depict cross-sectional diagrams of exemplary MTJ structures according to the present invention having high-spin polarization of tunneling current.
Figure 9B:
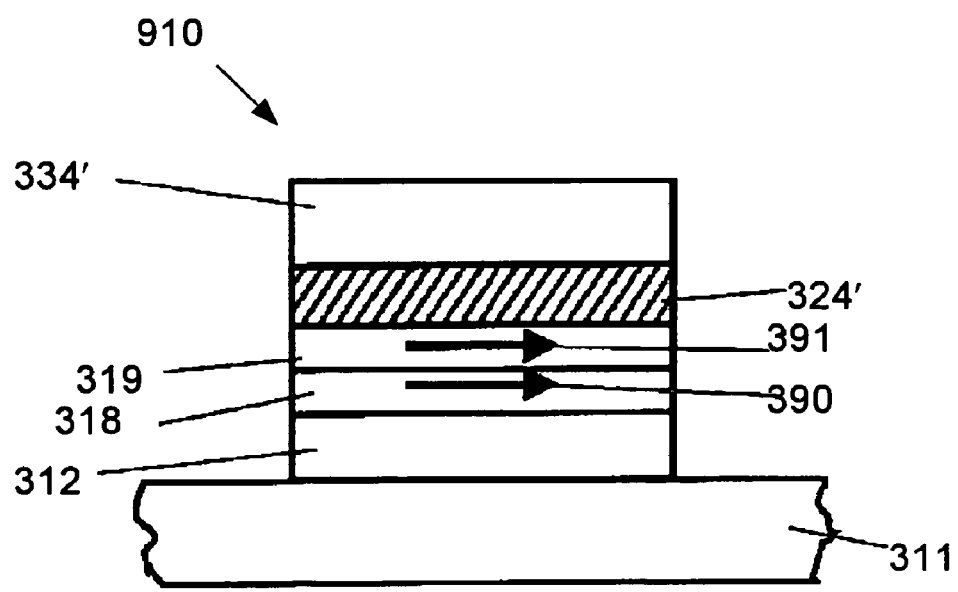
Figure 9C:
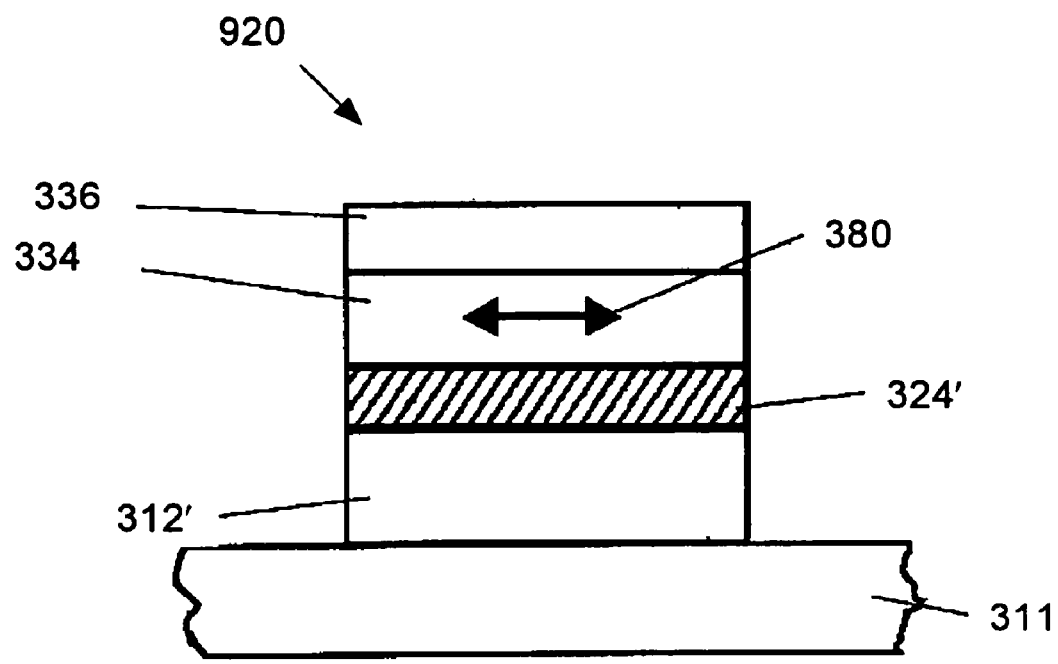

The high-spin polarization of the tunneling current using the MTJ structure of the present invention can be applied to a wide variety of tunnel junction devices in which one or the other or both of the metal layers on either side of the amorphous tunnel barrier do not need to be ferromagnetic. Illustrations of such exemplary structures are shown in FIGS. 9A-9C. FIG. 9A shows a tunnel junction device 900 in which the upper electrode is formed from a non-magnetic metal layer 334' that is adjacent to an amorphous tunnel barrier 324'. A lower electrode 312 is formed from an exchange-biased ferromagnetic layer in which layer 316 is an antiferromagnetic layer, such as IrMn, that is used to exchange bias, or fix, the magnetic moment of a ferromagnetic reference layer formed from a combination of an amorphous ferromagnetic layer 318, such as CoFeZr or CoFeB, and a thin ferromagnetic normally crystalline interface layer 319, such as a CoFe alloy. A tunneling current is passed through device 900, as shown by arrow 902 and is spin polarized by ferromagnetic layer 319. FIG. 9B illustrates an MTJ device 910 that is similar to MTJ device 900 in which the lower ferromagnetic electrode 312 is formed without an antiferromagnetic exchange-bias layer. Such a structure may be useful as part of a magnetic tunnel transistor (MTT). The MTT is a three-terminal device that is typically formed from a magnetic tunnel junction in combination with a semiconductor collector in which the semiconductor can be formed from, for example, GaAs or Si. One ferromagnetic electrode in the MTJ device forms the emitter, and the other ferromagnetic layer forms the base of the MTT three-terminal device between the tunnel barrier of the MTJ and the collector of the semiconductor. The MTJ component of the MTT could be formed as described herein with an amorphous tunnel barrier. It may, however, also be advantageous for certain applications that the emitter of the magnetic tunnel transistor be formed from a non-magnetic metal according to the structure shown in FIG. 9B.

FIG. 9C illustrates a tunnel junction device 920 in which the lower electrode is formed from a non-magnetic metal layer 312'. Layer 312' may be formed from more than one metal layers, including the possibility that the layer 312' may contain ferromagnetic layers that are not immediately adjacent to tunnel barrier 324'. The structure of tunnel junction device 920 may be useful as part of a MTT in which the emitter of the MTT is ferromagnetic, but the base layer is non-magnetic. In the structure illustrated in FIG. 9C, the interface layer is shown as layer 334 and the amorphous layer is shown as a non-magnetic amorphous layer 336. The direction of the magnetic moment of interface layer 334 is shown by arrow 380.

Figure 10:
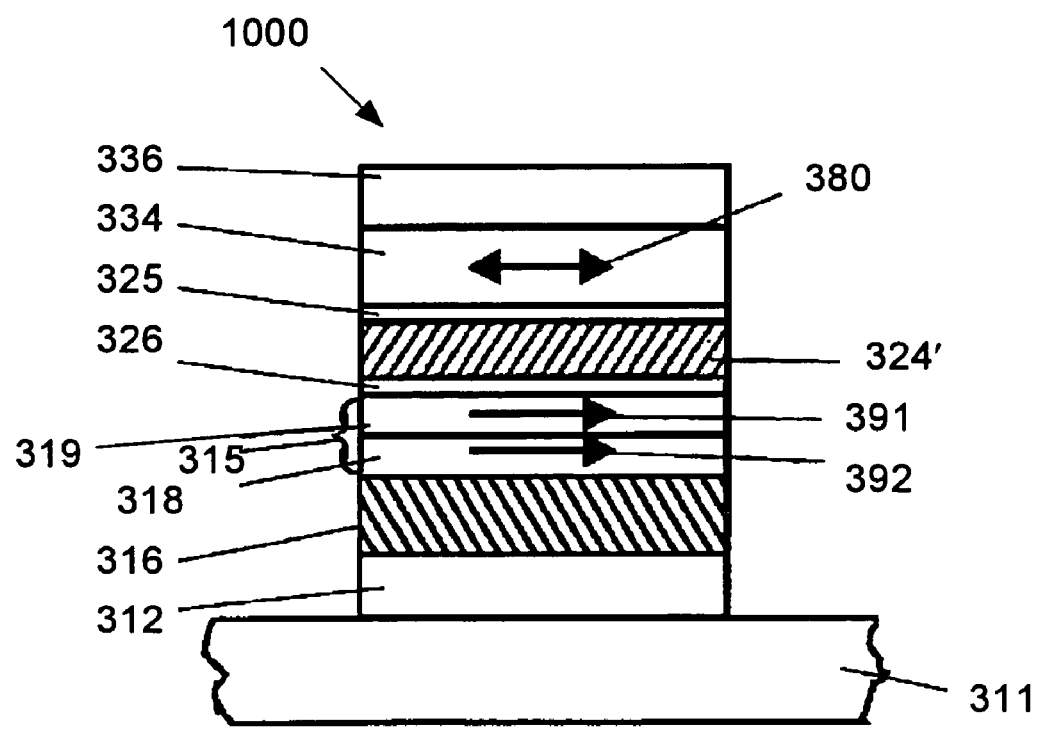
FIG. 10 depicts a cross-sectional diagram of an exemplary MTJ device according to the present invention having a thin spacer layer between a tunnel barrier and a ferromagnetic layer.

While a ferromagnetic interface layer is preferably in direct contact with amorphous tunnel barrier 324', it is also possible to separate the ferromagnetic electrode and the tunnel barrier by a thin spacer layer, providing that the spacer layer does not significantly diminish the spin polarization of the electrons tunneling through the tunnel barrier 324'. FIG. 10 illustrates a tunnel junction device 1000 having a thin spacer layer 325 between tunnel barrier 324' and free ferromagnetic layer 334 in the magnetic tunnel junction device of FIG. 3. As described in U.S. Pat. No. 5,764,567 to Parkin with reference to magnetic tunnel junction devices formed with alumina tunnel barriers, the ferromagnetic electrodes in such MTJs can be separated from the tunnel barrier by thin spacer layers formed from Cu and other non-magnetic metallic materials while maintaining significant tunneling magnetoresistance. The types of non-magnetic metallic materials that are preferred are those that display large values of giant magnetoresistance in metallic spin-valve structures or in metallic magnetic mnultilayers. These include Ag and Au, as well as Cu. The non-magnetic spacer layer could also be formed from a metallic-oxide layer, such as $RuO_2$ or a Sr—Ru oxide. As illustrated in FIG. 10, free ferromagnetic layer 334 and spacer layer 325 form an overlayer. Generally, the magnetic tunnel junction will include an overlayer formed on top of amorphous tunnel barrier 324', which may be formed of one or more ferromagnetic layers with or without a non-magnetic spacer layer, or, more generally, from a multiplicity of ferromagnetic and non-ferromagnetic, non-ferrimagnetic layers. Similarly, the magnetic tunnel junction will include an underlayer beneath tunnel barrier 324', which may be formed of one or more ferromagnetic layers with or without a non-magnetic spacer layer (e.g., spacer layer 326), or, more generally, from a multiplicity of ferromagnetic and non-ferromagnetic, non-ferrimagnetic layers.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming a magnetic tunnel element, compnsing:
   forming an amorphous tunnel barrier layer;
   forming an interface layer on the tunnel barrier layer; and
   forming a first layer on the interface layer, the first layer being formed from an amorphous material,
   the interface layer being formed from a material that is crystalline when the material is in isolation from both the tunnel barrier layer and the first layer, and the interface layer comprising a thickness selected so that the interface layer is amorphous.

2. The method according to claim 1, wherein forming the interface layer includes rapidly quenching the interface layer to make the interface layer amorphous.

3. The method according to claim 1, wherein forming the interface layer includes depositing the interface layer on the tunnel barrier layer at a cryogenic temperature, the interface layer including at least one of a ferromagnetic film and a ferrimagnetic film.

4. The method according to claim 1, further comprising bombarding the interface layer with energetic ions after the interface layer has been formed on the tunnel barrier layer, the interface layer including at least one of a ferromagnetic film and a ferrimagnetic film.

5. The method according to claim 1, wherein the interface layer is formed from at least one material selected from the group consisting of ferromagnetic materials and ferrimagnetic materials.

6. The method according to claim 5, wherein the first layer is formed from at least one material selected from the group consisting of amorphous ferromagnetic materials and amorphous ferrimagnetic materials.

7. The method according to claim 5, further comprising forming a second layer in contact with the tunnel barrier layer, the second layer including at least one material selected from the group consisting of ferromagnetic materials and ferrimagnetic materials, and
   wherein the first layer, the interface layer, the tunnel barrier layer, and the second layer form a magnetic tunnel junction.

8. The method according to claim 7, wherein the magnetic tunnel junction has a tunneling magnetoresistance that is greater than 50%.

9. The method according to claim 7, wherein the magnetic tunnel junction has a tunneling magnetoresistance that is greater than 60%.

10. The method according to claim 7, wherein the magnetic tunnel junction has a tunneling magnetoresistance that is greater than 65%.

11. The method according to claim 1, further comprising:
    forming a metal-containing layer in contact with the tunnel barrier layer; and
    forming a semiconductor layer that is in contact with the first layer,
    wherein the metal-containing layer, the tunnel barrier, the interface layer, the first layer and the semiconductor layer form a magnetic tunneling transistor.

12. The method according to claim 1, further comprising forming a semiconductor material layer in proximity with the tunnel barrier layer,
    wherein the semiconductor layer, tunnel barrier layer, the interface layer and the first layer form a device that can be used for at least one of spin injection and spin detection.

13. The method according to claim 1, wherein forming the interface layer comprises forming the interface layer with no glass-forming elements.

* * * * *